United States Patent [19]

Miyashita et al.

[11] Patent Number: 5,951,755
[45] Date of Patent: Sep. 14, 1999

[54] MANUFACTURING METHOD OF SEMICONDUCTOR SUBSTRATE AND INSPECTION METHOD THEREFOR

[75] Inventors: Moriya Miyashita, Yokkaichi; Masanobu Ogino, Yokosuka; Tadahide Hoshi, Kitakyushu; Masanori Numano, Yokohama; Shuichi Samata, Yokohama; Akiko Sekihara, Yokohama; Keiko Akita, Yokohama, all of Japan

[73] Assignee: Kabushiki Kaisha Toshiba, Kawasaki, Japan

[21] Appl. No.: 08/801,113

[22] Filed: Feb. 14, 1997

[30] Foreign Application Priority Data

Feb. 15, 1996 [JP] Japan .................................. 8-027970

[51] Int. Cl.$^6$ .................................................. C30B 25/92
[52] U.S. Cl. ................... 117/89; 117/85; 117/88; 117/94; 117/106
[58] Field of Search .................. 117/85, 88, 89, 117/94, 106

[56] References Cited

U.S. PATENT DOCUMENTS 5,141,894   8/1992   Bisaro et al. ............................ 117/94
5,769,942   6/1998   Maeda ..................................... 117/89

*Primary Examiner*—Felisa Hiteshew
*Attorney, Agent, or Firm*—Oblon, Spivak, McClelland, Maier & Neustadt, P.C.

[57] ABSTRACT

A manufacturing method for manufacturing a semiconductor substrate has first annealing step for annealing silicon single crystal to permit oxygen embryos or oxygen precipitations grown from the oxygen embryos precipitating in a predetermined region and a second annealing step for permitting said oxygen embryos or said oxygen precipitations to contract using a second temperature range higher than the first temperature range, said second temperature range being high enough to contract said oxygen embryos and low enough to prevent redistribution of boron from affecting to device characteristics, to form a denuded zone in said predetermined region at the principal surface. An inspection method for inspecting a semiconductor substrate further has measuring step, subsequent to said first and second annealing steps for measuring the density of oxygen embryos grown into oxygen precipitations among those precipitated in said silicon single crystal.

20 Claims, 10 Drawing Sheets

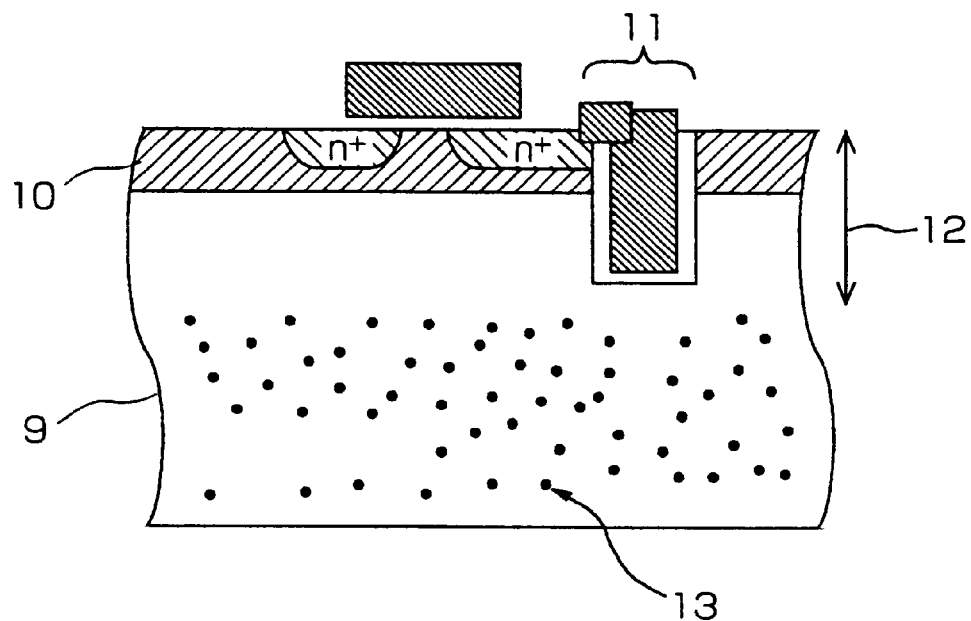
F I G. 2A

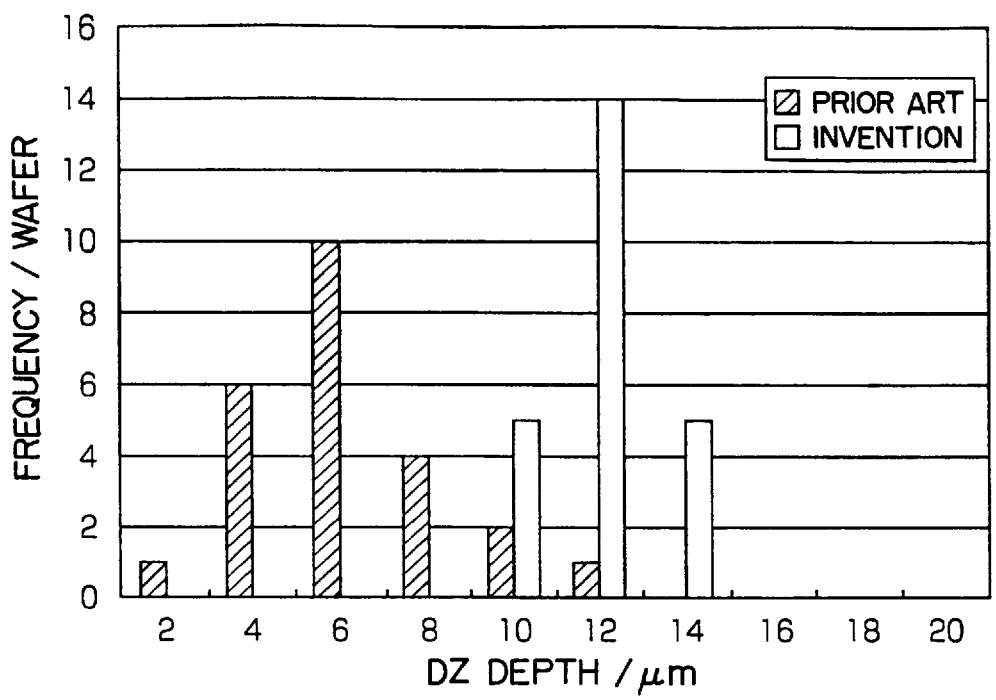
F I G. 3
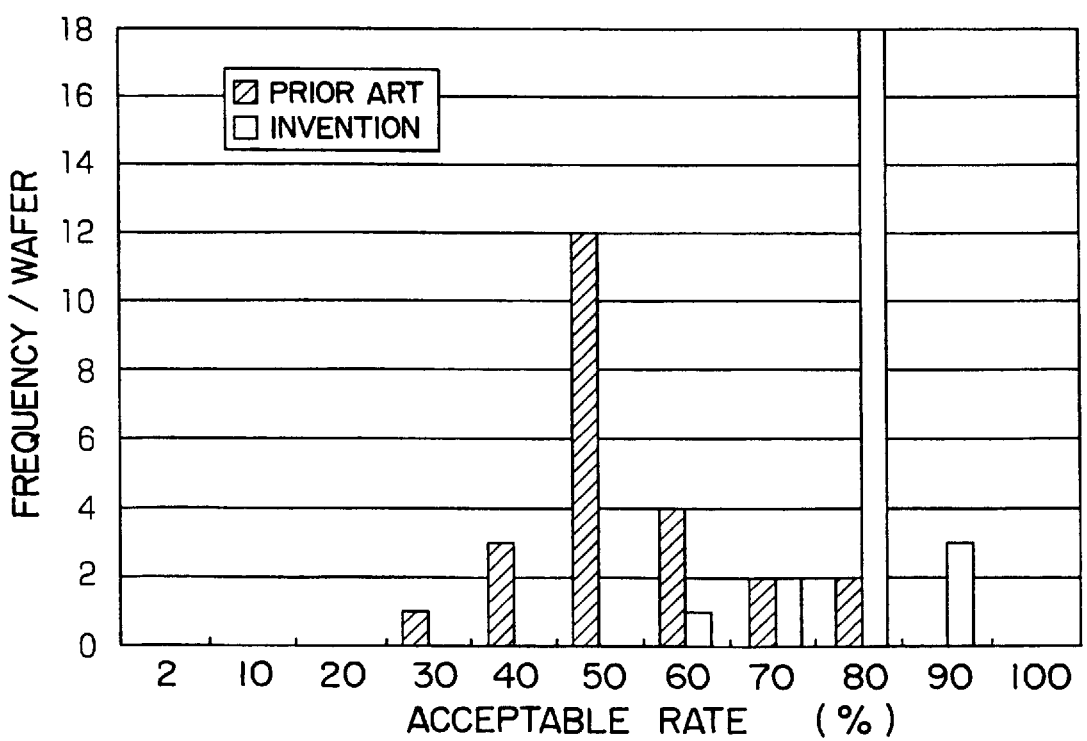
F I G. 4

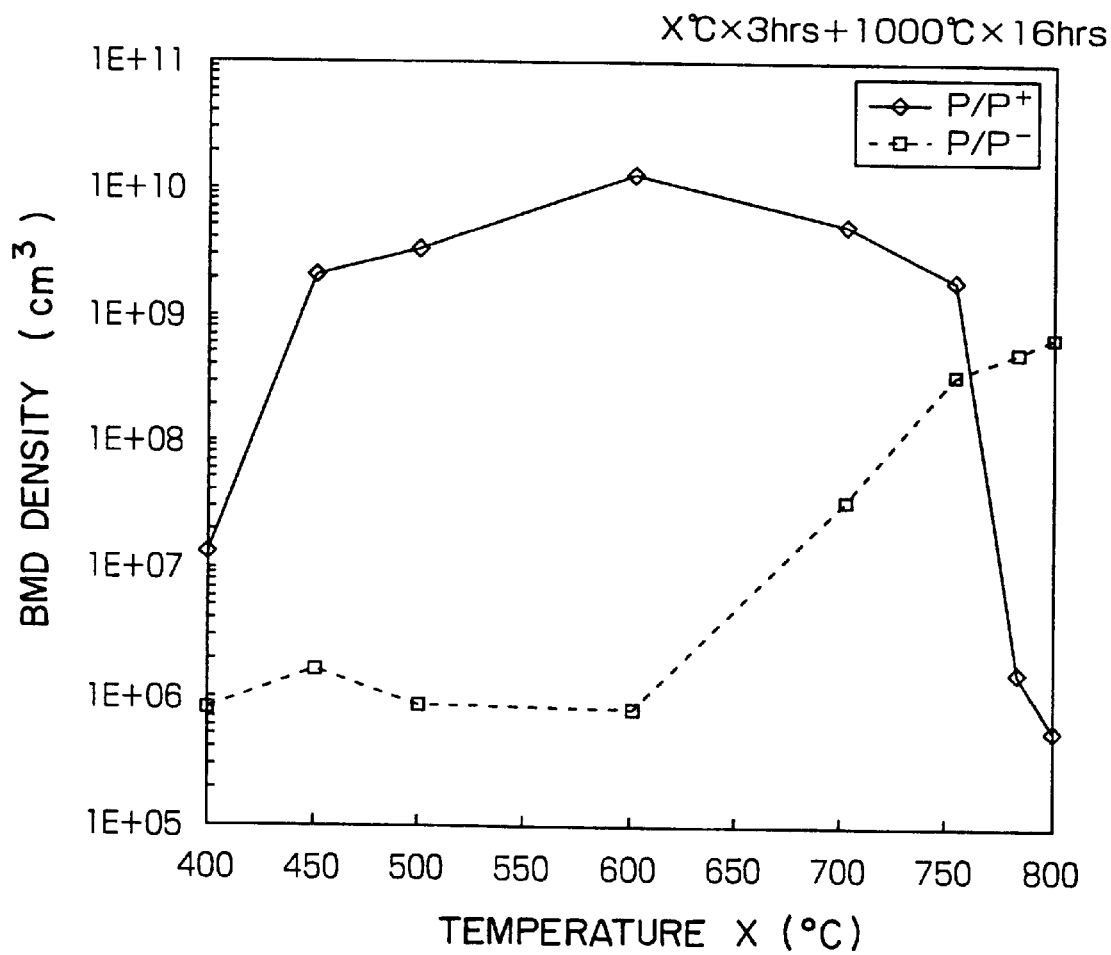
F I G. 6

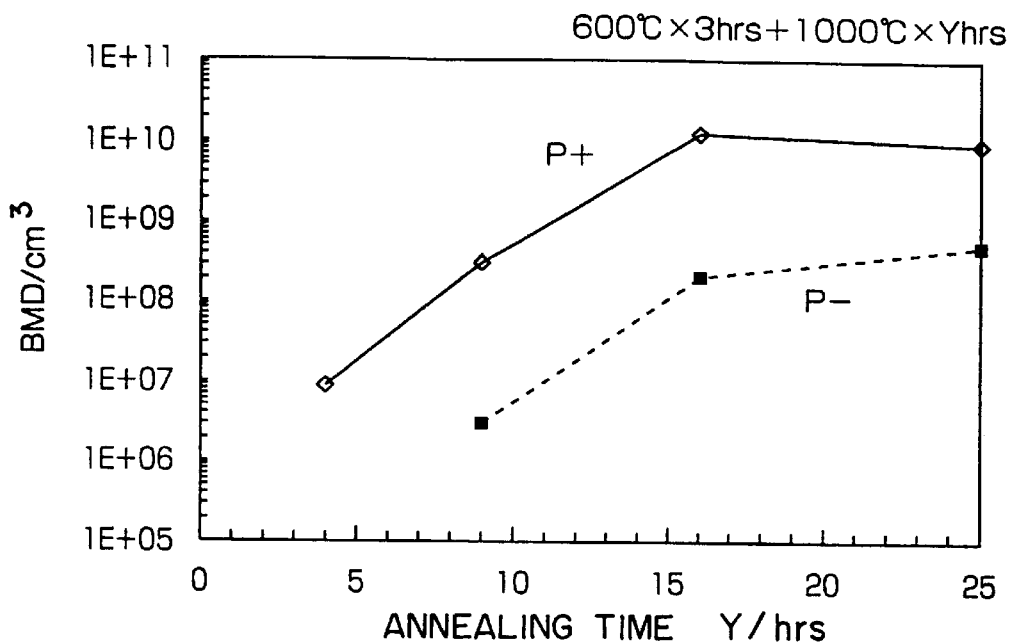
F I G. 7
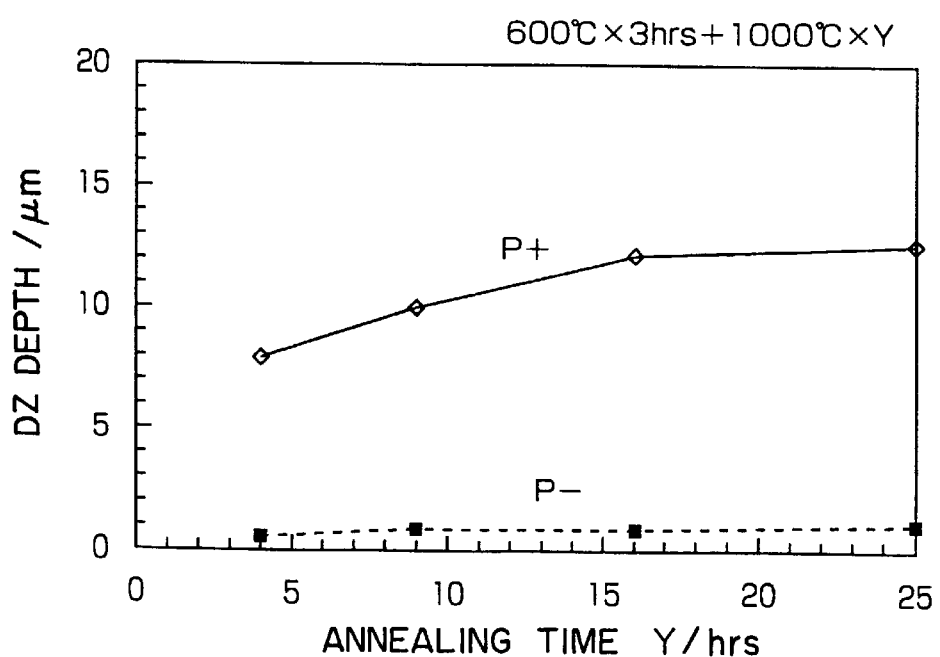
F I G. 8

MANUFACTURING METHOD OF SEMICONDUCTOR SUBSTRATE AND INSPECTION METHOD THEREFOR

BACKGROUND OF THE INVENTION

1. Field of the Invention

This invention relates to a manufacturing method of a semiconductor substrate and an inspection method therefor, which are particularly suitable for semiconductor substrates used in memory devices and logic devices having MOS structures.

2. Description of the Background Art

Silicon wafers mainly used to make up substrates of semiconductor devices are CZ silicon substrates cut out from a single crystal silicon made by the Czochralski (CZ) method. Additionally widely used are substrates (epitaxial wafers) made by forming a single crystal Si layer (epitaxial layer) on a CZ silicon substrate by vapor phase epitaxial growth.

It is known by an evaluation of dielectric breakdown of an oxide film of a capacitor made on a silicon substrate that oxygen precipitations (BMD: Bulk Micro Defect) resulting from precipitation of oxygen contained in a CZ silicon substrate causes degradation of characteristics. However, in the epitaxial layer of an epitaxial wafer, no oxygen enters into the epitaxially grown layer from vapor phase, and the epitaxial layer contains only interstitial oxygen that diffuses from the CZ silicon substrate during epitaxial growth process. Therefore, its oxygen concentration is very low, and degradation in integrity of the gate oxide film seldom occurs.

Apart from this, epitaxial wafers have other advantages. For example, since the conductive type of an epitaxial layer made on the substrate can be made different from the conductive type of the substrate, a circuit made thereon can be more easily designed to prevent latch-up. Especially, p-on-p$^-$ wafers having a p$^-$type layer on a p$^+$-type substrate are advantageous in improvement of soft error resistance, gettering function of metal impurities by boron in the p$^+$-type region, and so forth, and they are ideal substrates of high-integrated semiconductor devices. When a trench capacitor formed in a substrate is used as a memory cell of a DRAM device, an amount of electric charge over certain level must be held in the capacitor. By using the p$^+$-type substrates, expansion of the depletion layer around the trench capacitor can be suppressed, and a necessary amount of electric charge can be held easily.

From the structural viewpoint, p-on-p$^-$ wafers or n-on-p$^+$ wafers are suitable for use as substrates of high-integrated devices. However, they involve problems derived from their conductive type being p$^+$. It is already known that precipitation of interstitial oxygen is liable to increase rapidly as the boron concentration in the silicon substrate increases (especially $10^{18}$ atoms/cm$^3$ or more).

FIG. 14 is a graph showing changes in BMD density depending upon the boron concentration after annealing silicon wafers at 600° C. for three hours and at 1000° C. for 16 hours. It is known that the BMD density rapidly increases from boron concentrations around $10^{18}$ atoms/cm$^3$.

In case of the above-mentioned DRAM having the trench capacitor structure, since the trench capacitor is made in the p$^+$-type region, deterioration in strength of dielectric breakdown of the trench capacitor and other adverse affection to the device characteristics by highly dense BMD are expected.

Also in devices without the trench structure, if the PN junction extends to the BMD generating substrate portion, an increase in leak current and other deterioration in the PN junction occur. The depth of the active layer is relatively shallow in devices without the trench structure. Epi-wafers having p-on-p$^+$ structures, for example, can be made to keep the deep PN junction off the substrate by increasing the thickness of the epi-layer. However, the thickness of the epi-layer can be increased only to a limited amount in more miniaturized devices because the wafers must be highly plane but the flatness is degraded due to non-uniformity in thickness of the epi-layer as the epi-layer becomes thicker.

Explained below are a prior art technique and its technical knowledge for overcoming the problem.

The CZ method is a method to grow single crystal silicon using molten silicon as a material in a quartz crucible and a seed crystal of single crystal silicon. Oxygen enters into the silicon solution from the crucible and the atmosphere, and is taken into the single crystal silicon during solidifying. Therefore, the silicon crystalline silicon cooled to the room temperature contains an amount of oxygen beyond the solid-soluble limit. Oxygen in the single crystal silicon exists between silicon lattices. By heating the single crystal silicon at a relatively low temperature around or below 800° C., oxygen beyond the solid-soluble limit deposits in the silicon crystal and forms oxygen embryos made up from silicon and oxygen. The precipitation speed depends on the degree of super saturation and the oxygen diffusion speed. The degree of super saturation increases with a decrease in temperature, and the oxygen diffusion speeds increases with an increase in temperature. Therefore, annealing at a temperature approx. 600 to 800° C. (low-temperature annealing) is most liable to produce precipitation embryos. The size of each precipitation embryo is very small and is estimated to be 1 nm or less. The oxygen precipitation embryos grow large due to aggregation of oxygen around the precipitation embryo when annealed at a temperature around 1000° C. (medium-temperature annealing) and form oxygen precipitations (BMD). The grown oxygen precipitations (BMD) can be readily observed by an electron microscope, infrared scattering method, selective etching method, and so on.

Whether an oxygen embryo grows or contracts during low-temperature or medium temperature annealing depends on the size of the precipitated oxygen embryo and the oxygen concentration in the semiconductor substrate as already known. Oxygen embryos larger than a given size grow by annealing, but oxygen embryos smaller than a given size contract by annealing. The critical size of oxygen embryos between growth and contraction increases as the oxygen concentration in the semiconductor substrate becomes lower.

Since the density of oxygen precipitations increases with an increase in concentration of interstitial oxygen and with an increase in time of the low-temperature annealing and time of the subsequent medium-temperature annealing, the interstitial oxygen concentration in the surface layer must be decreased to form a non-defective layer (DZ: Denuded Zone) in the region for making the device up to the depth around 10 µm from the surface In order to make DZ in the device-forming region, typically used is a method of reducing the oxygen concentration in the silicon surface layer by annealing the wafer at a high temperature in a non-oxide atmosphere to externally disperse interstitial oxygen. In this case, the higher the temperature, the more effective the external dispersion of oxygen, and the temperature around 1200° C. is used.

A problem with high-temperature annealing beyond approximately 1100° C. is the need for a high technology and a high facility investment which inevitably increases the cost of final semiconductor products. Another problem with high-temperature annealing is an adverse affection to device characteristics due to redistribution of boron in a p-on-p$^+$ epi-wafer annealed at a high temperature.

SUMMARY OF THE INVENTION

It is therefore a primary object of the invention, in view of the above-mentioned problems, to provide a manufacturing method of a semiconductor substrate, which can form a non-defective layer (DZ) deep enough to prevent adverse affection to device characteristics when fabricating the semiconductor device using a p$^-$ wafer, without a high-temperature annealing process.

It is a secondary object of the invention to provide an appropriate inspection method of the density of oxygen precipitations (BMD) in the semiconductor substrate.

According to a first aspect of the present invention, there is provided a manufacturing method for manufacturing a semiconductor substrate comprising the steps of:

first annealing for annealing silicon single is crystal, using a first temperature range, said silicon single crystal having a region that contains boron by a first concentration higher than a predetermined value on a principal surface, to permit oxygen embryos or oxygen precipitations grown from the oxygen embryos precipitating in a predetermined region; and second annealing for permitting said oxygen embryos or said oxygen precipitations to contract using a second temperature range higher than the first temperature range, said second temperature range being high enough to contract said oxygen embryos and low enough to prevent redistribution of boron from affecting to device characteristics, to form a denuded zone in said predetermined region at the principal surface.

By this manufacturing method, a semiconductor having denuded zone with sufficient depth enough to prevent adverse effect against device characteristics without employing high temperature heating process is provided. Especially, since no high temperature process is employed, adverse effect to device characteristics by boron redistribution can be effectively avoided.

According to a second aspect of the present invention, there is provided an inspection method for inspecting a semiconductor substrate comprising the steps of:

first annealing step for annealing silicon single crystal, said silicon single crystal having a region that contains boron by a high concentration which permits oxygen embryos or oxygen precipitations grown from the oxygen embryos precipitating in a predetermined region to contract in a subsequent annealing step, said first annealing step using a temperature within a range which permits said oxygen embryos or said oxygen precipitations to contract in said subsequent annealing step;

second annealing step as said subsequent annealing step for annealing said substrate at a temperature that is higher than said range of temperatures used in said first annealing step, is high enough and sufficient to contract said oxygen embryos, and is within a range of temperatures low enough to prevent redistribution of boron from affecting to device characteristics; and measuring, subsequent to said first and second annealing steps for measuring the density of oxygen embryos grown into oxygen precipitations among those precipitated in said silicon single crystal.

By this inspection method, annealing time for the second annealing can be adequately determined.

BRIEF DESCRIPTION OF THE DRAWINGS

FIG. 2A is a cross-sectional view of a DRAM made by the manufacturing method of a semiconductor substrate according to the invention;

FIG. 3 is a graph showing DZ depths of semiconductor substrates according to the present invention and those of conventional semiconductor substrates measured by using the infrared scattering method and a transmission type electron microscope;

FIG. 4 is a graph showing evaluated values of resistance to voltage of oxide films in trench capacitors made on semiconductor substrates according to the invention and conventional semiconductor substrates;

FIG. 6 is a graph showing dependency of the BMD density in semiconductor devices obtained by two-step annealing upon the temperature during low-temperature annealing;

FIG. 7 is a graph showing relations between the medium-temperature annealing time and the BMD density obtained by two-step annealing while setting the low-temperature annealing time constant;

FIG. 8 is a graph showing relations between the medium-temperature annealing time and the DZ depth obtained by two-step annealing while setting the low-temperature annealing time constant;

DESCRIPTION OF THE PREFERRED EMBODIMENTS

Figure 1A:
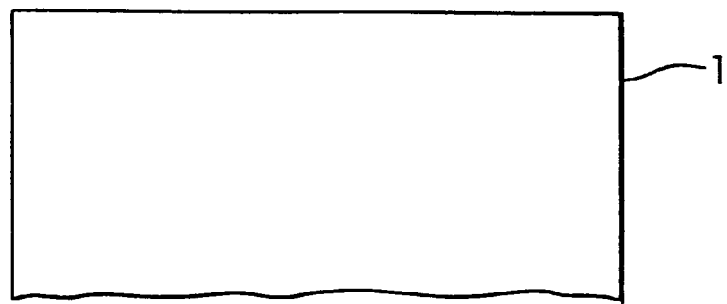
FIGS. 1A to 1C are explanatory diagrams schematically showing a manufacturing process by a manufacturing method of a semiconductor substrate according to the present invention.

Explained below are some embodiments of the invention with reference to the attached drawings.

The invention prevents formation of BMD which possibly gives adverse effect to device characteristics in a wafer surface layer during fabrication of the device from a p$^+$ wafer or a p-on-p$^+$ wafer. More specifically, a p-type wafer containing high-concentrated boron is annealed at temperatures approximately from 450° C. to 750° C. for a predetermined time so that, by subsequent medium-temperature annealing for a necessary and sufficient time (approximately at 900 to 1100° C.), oxide sediments (BMD) are formed in an electrically inactive bulk region where no device is formed, while a sufficient non-defective layer (DZ) is formed in a surface layer where the device is to be made.

The invention is based on the aforementioned technical knowledge of conventional techniques and new additional knowledge obtained from experiments explained below.

Using semiconductor substrates prepared by epitaxially growing 3 μm-thick single crystal silicon on a p⁻ wafer (specific resistance of 5 Ω cm and boron concentration of $2.7 \times 10^{15} cm^{-3}$) and a p⁺ wafer (specific resistance of 0.008 Ωcm and boron concentration of $2 \times 10^{19} cm^{-3}$), the following experiments were made taking as a parameter the temperature of low-temperature annealing executed to form oxygen precipitations. Both base wafers are CZ substrates having the interstitial oxygen concentration of $1.0 \times 10^{18}$ atoms/cm³. In two-step annealing (low-temperature plus medium temperature (approximately 1000° C.)), the temperature of the low-temperature annealing was set at approximately 400 to 800° C., and cross-sectional surfaces of the semiconductor substrates after the two-step annealing were subjected to Sirtl etching using an etchant including HF:100 cc, $CrO_2$:50 g, $H_2O$:100 cc to selectively etch off the BMDs. Thus, desired BMD densities were obtained.

FIG. 6 is a graph showing dependency of the BMD density in the semiconductor substrates upon the temperature of the low-temperature annealing. As shown in FIG. 6, wafers using p⁻ wafers as their base bodies exhibit very high BMD densities at temperatures around 450 to 750° C., and exhibit maximum values at 600° C. approximately.

Next used were a p wafer (specific resistance of 5Ω cm and boron concentration of $2.7 \times 10^{15} cm^{-3}$) and a p⁺ wafer (specific resistance of 0.008Ω cm and boron concentration of $2 \times 10^{19} cm^{-3}$) to conduct the following experiments.

Using substrates after two-step annealing (low-temperature (about 600° C.) plus medium-temperature (about 1000° C.)) while maintaining the low-temperature annealing time constant, and using the medium-temperature annealing time as a parameter, relations between the medium-temperature annealing time and the BMD density and relations between the medium-temperature annealing time and the DZ depth were obtained. Moreover, using substrates after two-step annealing (low-temperature (about 600° C.)) plus medium-temperature (about 1000° C.)) while setting the medium-temperature annealing time constant, and using the low-temperature annealing time as a parameter, relations between the low-temperature annealing time and the BMD density and relations between the low-temperature annealing time and the DZ depth were obtained. The interstitial oxygen concentration was $1.0 \times 10^{18}$ atoms/cm⁻³ in both CZ substrates.

Figure 9:
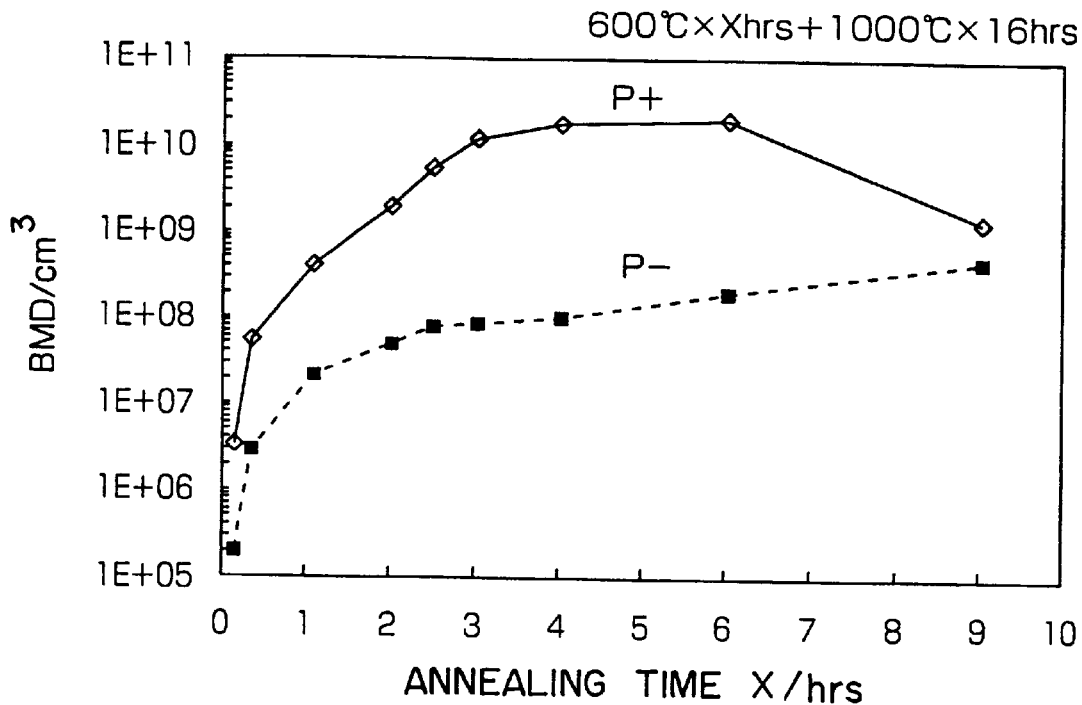
FIG. 9 is a graph showing relations between the low-temperature annealing time and the BMD density obtained by two-step annealing while setting the medium-temperature annealing time constant.
Figure 10:
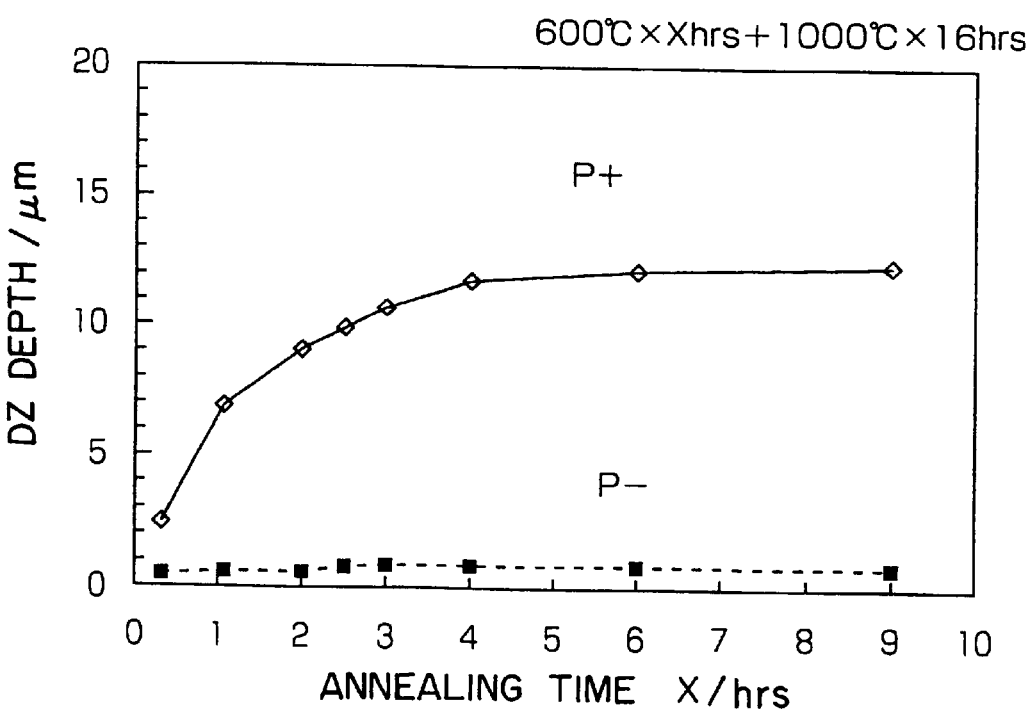
FIG. 10 is a graph showing relations between the low-temperature annealing time and the DZ depth obtained by two-step annealing while setting the medium-temperature annealing time constant.

FIG. 7 and FIG. 8 are graphs showing relations between the medium-temperature annealing time and the BMD density (dependency of the BMD density upon 1000° C. annealing time) and relations between the medium-temperature annealing time and the DZ depth (dependency of the DZ depth upon 1000° C. annealing) when the substrates were annealed by two-step annealing (low-temperature (about 600° C.) plus medium-temperature (about 1000° C.) while setting the low-temperature annealing time constant. FIG. 9 and FIG. 10 are graphs showing relations between the low-temperature annealing time and the BMD density (dependency of the BMD density upon 600° C. annealing time) and relations between the low-temperature annealing time and the DZ depth (dependency of the DZ depth upon 600° C. annealing) when the substrates were annealed by two-step annealing (low-temperature (about 600° C.) plus medium-temperature (about 1000° C.) while setting the medium-temperature annealing time constant. Used for measurement of the BMD density and the DZ depth was a method of introducing infrared rays from the wafer surfaces and estimating the scattered light.

From the results of the above-mentioned experiments, the following facts have been found. In p⁻ wafer, no DZ is under any of these conditions. In p⁻ wafers, however, the DZ depth increases with the time of medium-temperature annealing and even with the time of low-temperature.

Figure 11:
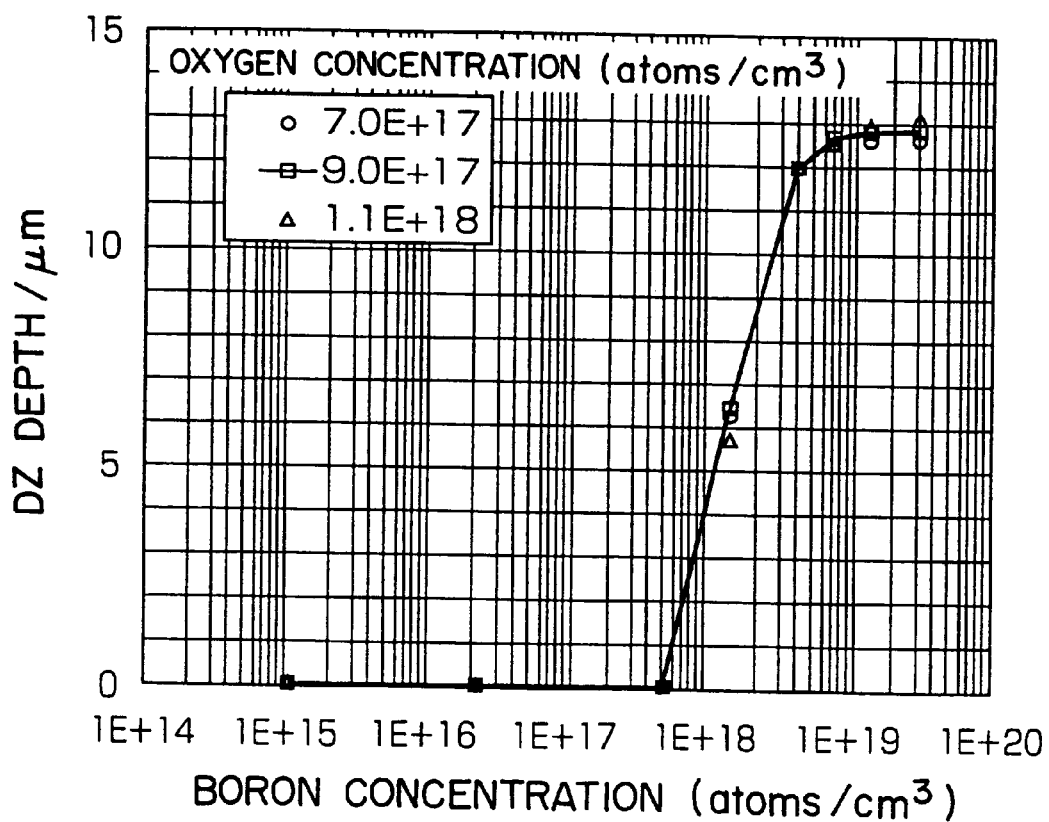
FIG. 11 is a graph showing dependency of the DZ depth upon the temperature of low-temperature annealing.
Figure 12:
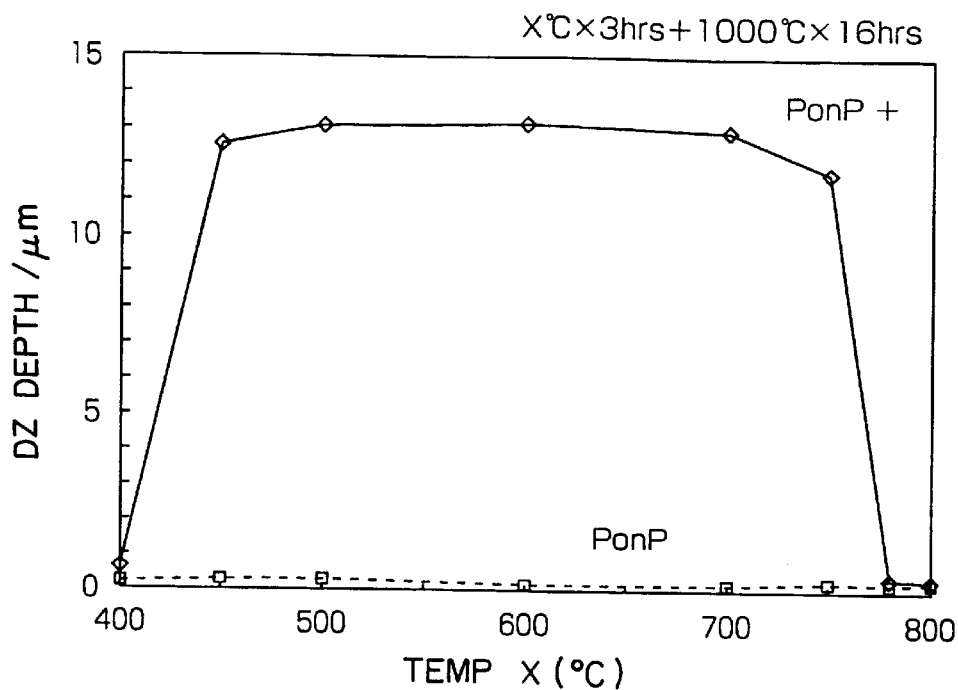
FIG. 12 is a graph showing dependency of the DZ depth upon the temperature of low-temperature annealing.
Figure 13:
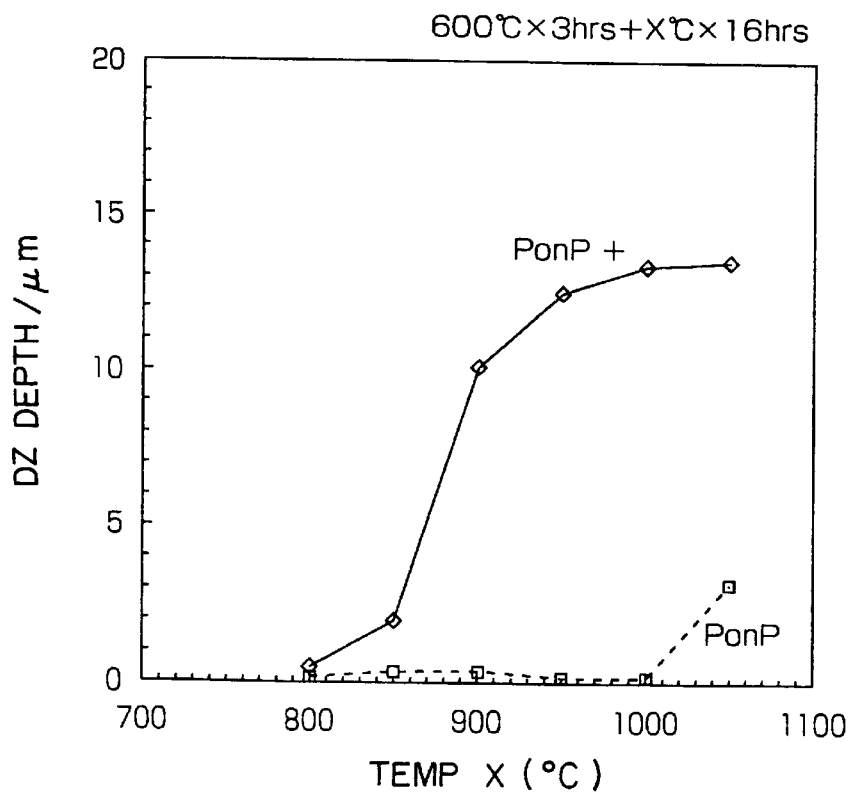
FIG. 13 is a graph showing dependency of the DZ depth upon the temperature of low-temperature annealing.

Additional graphs are shown regarding dependency of the DZ depth upon the boron concentration, dependency of the DZ depth upon low-temperature annealing and dependency of the DZ depth upon medium-temperature annealing which are proved from experiments. FIG. 11 is a graph showing dependency of the DZ depth upon the boron concentration, FIG. 12 is a graph showing dependency of the DZ depth upon the temperature of low-temperature annealing, and FIG. 13 is a graph showing dependency of the DZ depth upon the temperature of medium-temperature annealing.

It has been found from FIG. 11 that the DZ depth rapidly increases as from the boron concentration around $1 \times 10^{18} cm^{-3}$ of the semiconductor substrates and is stabilized at a level as high as 12 to 13 μm at values of the boron concentration around $1 \times 10^{18} cm^{-3}$. It has been found from FIG. 12 that a sufficient DZ depth can be obtained when the temperature of low-temperature annealing is 450 to 750° C. approximately. Known from FIG. 13 is that the DZ depth suddenly increases as from the temperature of medium-temperature annealing around 850° C. and that a sufficient DZ depth can be obtained at 900° C. approximately. Even from FIG. 12 and FIG. 13, it has been found that no DZ is formed in p⁻ wafers under any of these conditions.

Figure 14:
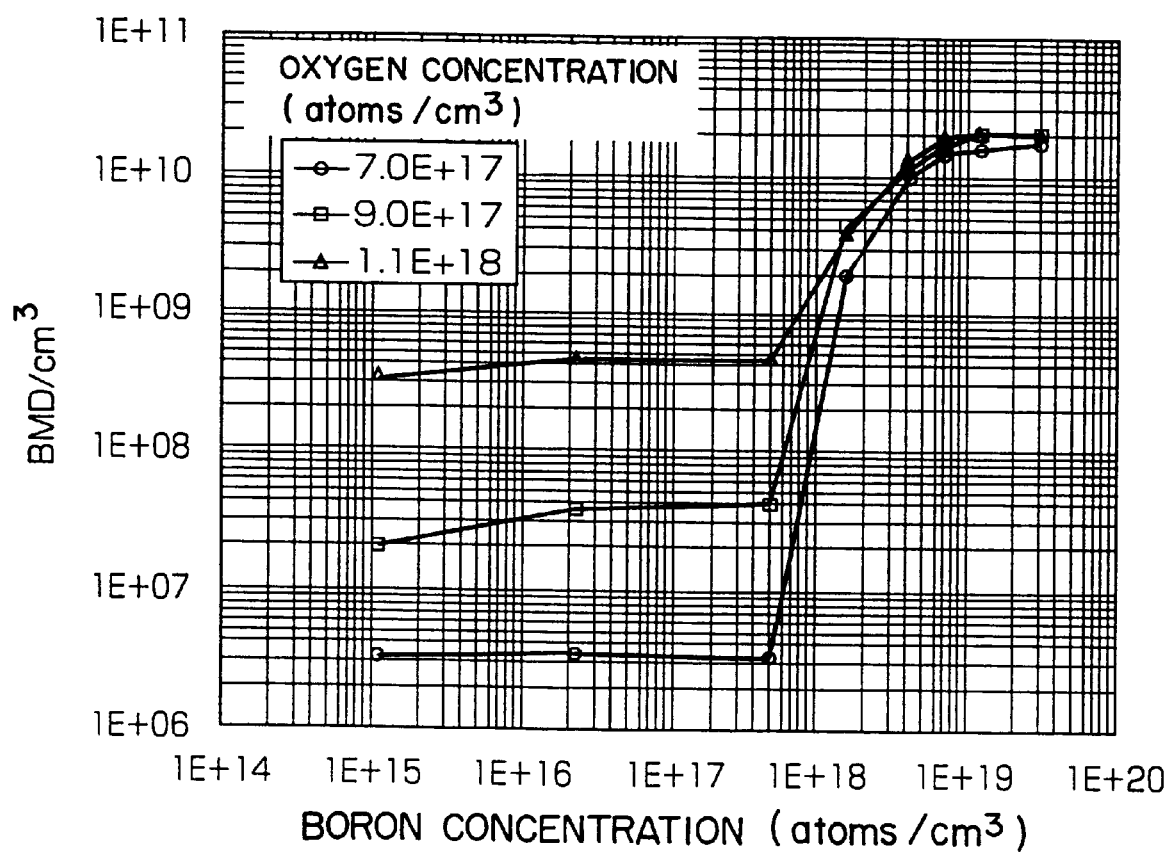
FIG. 14 is a graph showing dependency of the BMD density upon the boron concentration.

These facts can be explained as follows. Since the oxygen precipitation forming speed is very fast in silicon wafers containing high-concentrated boron of $10^{18} cm^{-3}$ or more, oxygen embryos are produced in a high density. This is as shown in FIG. 14. Although the BMD density increases with the time of low-temperature annealing at approximately 600° C. as shown in FIG. 9, the BMD density decreases in p⁺ wafers when the time of approximately 600° C. annealing exceeds six hours. The reason is considered that although the oxygen embryos tend to grow during medium-temperature annealing while catching oxygen around them, when the density of the oxygen embryos is excessively high, they scramble for oxygen, which results in restricting their growth and rather contracting small-sized embryos. Especially in the superficial region, since the interstitial oxygen concentration decreases more and more due to external dispersion of interstitial oxygen, and oxygen embryos cannot grow and rather contract, DZ is formed by medium-temperature annealing around 900° C. to 1100° C.

It has also been found from FIG. 8 that, since the DZ depth increases with the time of medium-temperature annealing, not only superficial oxygen embryos but also oxygen precipitations grown from the oxygen embryos disappear by medium-temperature annealing.

It is conventionally believed that high-temperature annealing around 1200° C. be necessary for disappearance of grown oxygen precipitations. In the present invention, however, since the BMD density is very high and individual BMDs are small, contraction or disappearance of oxygen precipitations occurs even by medium-temperature annealing around 900° C. to 1100° C.

That is, although oxygen embryos appear in a high density in silicon single crystal containing a high density of boron, a DZ region can be made easily near the surface by subsequent medium-temperature annealing around 1000° C.

Conditions of the manufacturing method of a semiconductor substrate according to the invention are introduced from the above-explained experimental results and new technical knowledge. The first condition is that the boron concentration contained in the semiconductor substrate is approximately $10^{18} cm^{-3}$ or more. This level of concentration can be obtained with a sufficiently high density of oxygen embryos. The second condition is the temperature of low-temperature annealing being approximately 450 to 750° C. This is an acceptable level of temperature for making oxygen embryos with necessary and sufficient concentrations and with appropriate sizes. The third condition is the low-temperature annealing time being approximately three hours. The fourth condition is the temperature of medium-temperature annealing being 900 to 1100° C. This is a temperature permitting BMD to grow in a region where no device is made while forming DZ in a device-forming region. The fifth condition is the medium-temperature annealing time being approximately six hours. These conditions, however, are prescribed by the condition that a sufficiently deep DZ is finally obtained.

The method for introducing high-concentrated boron into semiconductor substrates may use a wafer in which $p^-$-type region is formed by ion implantation, solid phase dispersion or other like method other than a wafer made from $p^+$-type silicon single crystal.

It has been found from experiments that the manufacturing method of a semiconductor substrate according to the invention can make sufficiently deep DZ in the device-forming region of the $p^+$ wafer whichever the epitaxial growth of the single crystal silicon layer on a $p^-$ wafer is effected, before or after low-temperature annealing or medium-temperature annealing. The single crystal silicon layer formed on the $p^+$ wafer may be either of the p-type or the n-type.

Figure 1B:
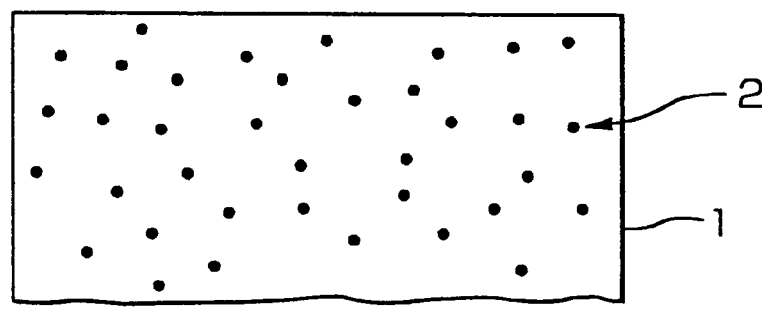
Figure 1C:
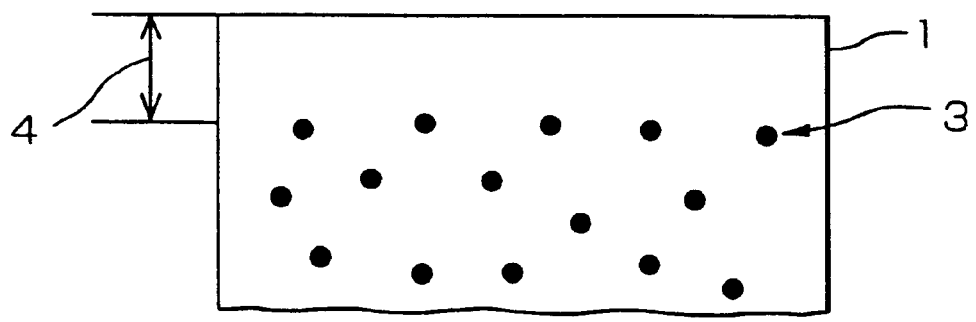

FIGS. 1A to 1C are explanatory diagrams schematically showing a process by the manufacturing method of a semiconductor substrate according to the invention.

First prepared is a $p^-$ wafer 1 containing boron of a concentration around $10^{18} cm^{-3}$ or more (FIG. 1A). The $p^-$ wafer 1 is annealed by low-temperature annealing at temperatures around 450 to 750° C. for approximately three hours to form oxygen embryos 2 with a necessary and sufficient concentration and size (FIG. 1B). When the $p^-$ wafer is annealed by additional medium-temperature annealing at temperatures around 900 to 1100° C. for approximately six hours, oxygen precipitations (BMD) 3 are formed in an electrically inactive bulk region where no device is formed, but a non-defective layer (DZ) 4 having sufficient depth is formed in a superficial layer where a device is to be made (FIG. 1C).

Explained below are conditions for manufacturing wafers according to different embodiments which are made by the semiconductor substrate manufacturing method according to the invention.

A wafer according to the first embodiment was made in the following manner.

Epitaxially grown is a silicon single crystal layer having the thickness of 2.5 μm and the boron concentration of $2\times10^{15}$ atoms/cm³ on a silicon wafer having the diameter of 200 mm and containing $1\times10^{19}$ to $2\times10^{19}$ atoms/cm³ of boron and $8\times10^{17}$ atoms/cm³ of oxygen, using trichlorosilane (SiHCl₃) as a material gas at 1150° C. The wafer is held in a dry oxygen atmosphere at 600° C. for six hours, using a vertical resistance heating furnace. The wafer is used as the substrate for making a device.

A wafer according to the second embodiment was made in the following process.

A silicon wafer having an epitaxial layer made by the same method as the first embodiment is held in a dry oxygen atmosphere in a vertical resistance heating furnace at the temperature of 600° C. for six hours, then heated to 1000° C. at the rate of 5° C./minute, and held for 10 hours. After that, the temperature is decreased at the rate of −10° C. per minute, and the wafer is taken out from the furnace. The wafer is used as the substrate for making a device.

A wafer according to the third embodiment was fabricated in the following process.

A single crystal ingot containing boron in the range of $1\times10^{19}$ to $2\times10^{19}$ atoms/cm³ is held in a resistance heating furnace at the temperature of 700° C. for 10 hours. After that, a wafer is cut out from the ingot, and a 3 μm-thick epitaxial layer is formed. The wafer is used as the substrate for making a device.

A wafer according to the fourth embodiment was fabricated in the following process.

A silicon wafer having the diameter of 200 mm and containing $1\times10^{19}$ to $2\times10^{19}$ atoms/cm³ of boron and $8\times10^{17}$ atoms/cm³ of oxygen is held in a dry oxygen atmosphere in a vertical resistance heating furnace at the temperature of 600° C. for six hours. After that, a 3 μm-thick silicon single crystal layer containing boron by the concentration of $2\times10^{15}$ atoms/cm³ is epitaxially grown at 1150° C. using trichlorosilane (SiHCl₃) as a material gas. The wafer is used as the substrate for making a device.

A wafer according to the fifth embodiment was fabricated in the following process.

Polycrystalline silicon is grown to the thickness of 2 μm by vacuum CVD on a silicon wafer containing $1\times10^{19}$ atoms/cm³ of boron and $1.0\times10^{18}$ atoms/cm³ of oxygen. The temperature is about 620° C., and the material gas is silane SiH⁴). One of surfaces of the wafer is subjected to mechano-chemical polishing to obtain a mirror surface by removing its polycrystalline silicon layer and a part of the underlying single crystal silicon layer. The wafer is used as the substrate for making a device.

A wafer according to the sixth embodiment was made in the following process.

A 3 μm-thick silicon layer containing boron by the concentration of $2\times10^{15}$ atoms/cm³ is epitaxially grown in vapor on a silicon wafer containing $2\times10^{19}$ atoms/cm³ of boron and $7\times10^{17}$ atoms/cm³ of oxygen. The wafer is held in a dry oxygen atmosphere in a typical resistance heating furnace at the temperature of 600° C. for six hours. Then, the temperature is decreased to 1000° C. at the rate of 5° C./minute and maintained for 10 hours. After that, the temperature is decreased to 800° C. at the rate of −10° C./minute, and the wafer is taken out from the furnace. The wafer is used as the substrate for making a device.

A wafer according to the seventh embodiment was prepared in the following manner.

In a process for making a DRAM having a trench capacitor on a wafer prepared by epitaxially growing a 2.5 μm-thick silicon single crystal layer containing boron by the concentration of $2.5\times10^{16}$ atoms/cm³ on a silicon wafer containing $1.5 \times 10^{19}$ atoms/cm$^3$ of boron, after a trench is opened by RIE (Reactive Ion Etching) method, polycrystalline silicon is deposited by LP-CVD (Low Pressure Chemical Vapor Deposition) method to fill in the trench. The processing temperature in this process is 625° C., and the processing time is three hours. After this process, the product is held in a nitrogen atmosphere at the temperature of 1000° C. for 16 hours.

A wafer according to the eighth embodiment was prepared in the following process.

A 2.5 μm-thick silicon single crystal layer containing phosphor by the concentration of $1 \times 10^{15}$ atoms/cm$^3$ is formed in vapor by epitaxial growth on a silicon wafer containing $1 \times 10^{19}$ atoms/cm$^3$. After the wafer is held in a dry oxygen atmosphere in a typical resistance heating furnace at the temperature of 600° C. for six hours, it is heated to 1000° C. at the rate of 5° C./minute and held for 10 hours. After that, the temperature is decreased to 800° C. at the rate of −10° C./minute, and the wafer is taken out from the furnace. The wafer is used as the substrate for making a device.

In the above embodiments, the temperature for low-temperature annealing must be in the range of approximately 450 to 750° C. to form high density BMD as shown in FIG. 6 as explained above. The low-temperature annealing time is preferably three hours or more to obtain sufficiently deep DZ as shown in FIG. 10.

Even when nitrogen, hydrogen, argon or their mixed gas is used in lieu of oxygen as the atmosphere for annealing around 450 to 750° C. in the above embodiments, equivalent effects are obtained. That is, only if the thermal condition satisfies the condition of the present invention, there is no particular restriction in selecting the gas used as the atmosphere for low-temperature annealing. Even in the process for accumulating a polycrystalline silicon layer like in the fifth embodiment, equivalent effects are obtained regardless of the sort of material gas if the conditions on temperature and time are satisfied.

When a semiconductor device is fabricated using a silicon single crystal substrate containing boron in the range of $10^{16}$ to $10^{21}$ atoms/cm$^3$, which has been prepared by any one of the above embodiments, it is necessary to measure the density of oxygen precipitations after low-temperature annealing at temperatures in the range around 450 to 750° C. for forming oxygen embryos and medium-temperature annealing at temperatures in the range around 900 to 1100° C. both for the growth of oxygen embryos and for forming DZ, in order to execute the semiconductor substrate inspection method for knowing estimated degrees of BMD density and DZ depth. In this case, since the DZ depth is determined by the oxygen depth distribution by dispersion of oxygen and by medium-temperature annealing as explained above, annealing at approximately 900° C. or more affects the formation of DZ. Therefore, the thermal history in the semiconductor device manufacturing process must simulated exactly in order to exactly estimate the DZ depth formed in the manufacturing process of the semiconductor device.

More specifically, the medium-temperature annealing time may be set so that the oxygen dispersion depth in the first and second annealing steps and in all annealing steps during the semiconductor device manufacturing process using the finished semiconductor substrate can ensure a necessary depth of the non-defective layer. The dispersion depths L by annealing at the temperatures of $T_1, T_2, \ldots T_n$ for the time $t_1, t_2, \ldots t_n$ can be obtained from $L=(D_1 t_1 + D_2 t_2 \ldots + D_n t_n)^{1/2}$ where the oxygen diffusion coefficients in silicon at the respective temperatures are $D_1, D_2 \ldots, D_n$.

When the substrate according to the invention was actually used for a 64 M DRAM, the time of annealing at 1000° C. was 3.5 hours, and the time of annealing at 1050° C. was 2.5 hours. Although additional annealing below 1000° C. was effected, its data was omitted from calculation because its affection to the dispersion depth can be neglected. Used as the oxygen diffusion coefficients were values of Mikkelsan et al. ($1.56 \times 10^{-11}$ cm$^2$s$^{-1}$ at 1000° C. and $363 \times 10^{-11}$ cm$^2$s$^{-1}$ at 1050° C.). As a result, the oxygen diffusion depth in the manufacturing process of the 64 M DRAM was 7.2 μm. It is known therefore that the annealing time may be set at 9.3 hours to ensure the same diffusion depth by 1000° C. annealing. Taking a substrate prepared by first annealing the semiconductor substrate subjected to the processing explained with the first embodiment at the temperature of 600° C. for three hours and by next annealing it at the temperature of 1000° C. for 9.3 hours, and a DRAM made by using the substrate, their DZ depths were estimated using a transmission-type electron microscope. As a result, they were 10.5 μm and 10.2 μm acceptably coincident with each other, and were substantially coincident also with the calculated oxygen dispersion depth 7.2 μm, taking the thickness 2.5 μm of the epitaxially grown silicon single crystal layer and errors in measurement into account.

As apparent from the above-explained embodiments, experimental results and other materials, the semiconductor substrate manufacturing method according to the invention can make the device-forming region as a non-defective layer in a silicon wafer having a p-on-p$^+$ structure or an n-on-p$^−$ structure. A semiconductor device according to an embodiment was fabricated using the semiconductor substrate in the process explained below.

A 2.5 μm-thick silicon layer containing boron by the concentration of $2 \times 10^{15}$ atoms/cm$^3$ on a silicon wafer containing $2 \times 10^{19}$ atoms/cm$^3$ of boron and $7 \times 10^{17}$ atoms/cm$^3$ of oxygen. The wafer is held in a dry oxygen atmosphere in a typical resistance heating furnace at the temperature of 600° C. for six hours. After that, the wafer is heated to 1000° C. at the rate of 5° C./minute, and held for 10 hours. Then, the temperature is decreased to 800° C. at the rate of −10° C./minute, and the wafer is taken out from the furnace. The wafer is used as the substrate for making a DRAM having a 7.5 μm-deep trench capacitor.

Figure 2B:
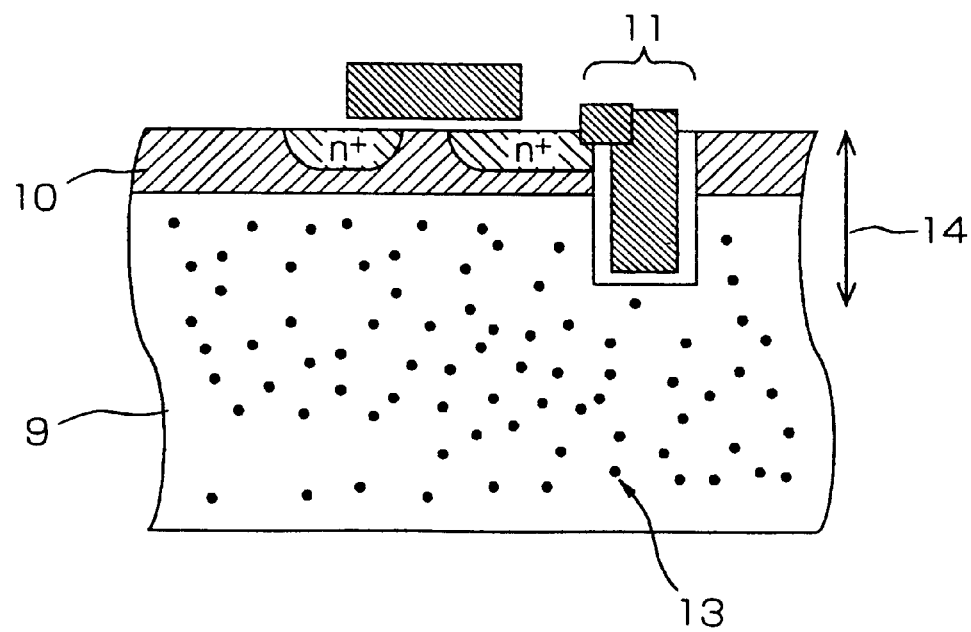
FIG. 2B is a cross-sectional view of a DRAM made by a conventional manufacturing method.

FIG. 2A shows a cross-sectional view of the DRAM fabricated by the semiconductor substrate manufacturing method according to the invention and FIG. 2B shows cross-sectional view of a DRAM made by a conventional manufacturing method. In both DRAMs, the semiconductor substrate has a single crystal silicon layer 10 epitaxially grown on a p$^+$ wafer 9. However, they are different in boron concentration, oxygen concentration, annealing process, and so forth, as explained above.

FIG. 2A shows a cross-sectional structure of a DRAM device having a 7.5 μm-deep trench capacitor in a semiconductor substrate. In its device-forming region, BMD 13 does not exists, but DZ 12 is formed. In contrast, FIG. 2B shows that a BMD 13 is formed even in its device-forming region 14 which corresponds to DZ 12 according to the present invention.

In the regions 10 μm-deep and more, which are outside the device-forming regions 14, BMD densities of the substrate according to the invention and the conventional substrate are $5 \times 10^{10}$ cm$^{-3}$ and $3 \times 10^{10}$ cm$^{-3}$ which are approximately equal.

FIG. 3 is a graph showing DZ depths of wafers according to the invention and conventional wafers, which were measured by using the infrared scattering method and a transmission electron microscope. As apparent from the graph, DZ depths are 10 μm or less in almost all of the semiconductor substrates prepared by the conventional method. In contrast, DZ depths of 10 μm or more are ensured in the semiconductor substrates according to the invention, which means that a sufficient non-defective layer is formed in the device-forming region.

DZ widths of DRAMs made by using wafers according to the first to seventh embodiments were 12 μm, 12 μm, 13 μm, 11 μm, 12 μm, 13 μm and 13 μm, respectively.

FIG. 4 is a graph showing evaluated resistances to voltage of oxide films in 0.6 μm-wide, 7 μm-deep trench capacitors formed in silicon wafers according to the invention and conventional silicon wafers. The gate oxide films are 10 nm-thick thermal oxide films, and products having a breakdown field of 8 μv/cm or more were deemed acceptable. It is known from the results shown in FIG. 4 that the invention significantly improved the resistance to voltage of the oxide films.

As explained above, semiconductor devices made from semiconductor substrates prepared by the semiconductor substrate manufacturing method according to the invention can be provided with device-forming regions as non-defective layers in a wider range of BMD densities.

Figure 5:
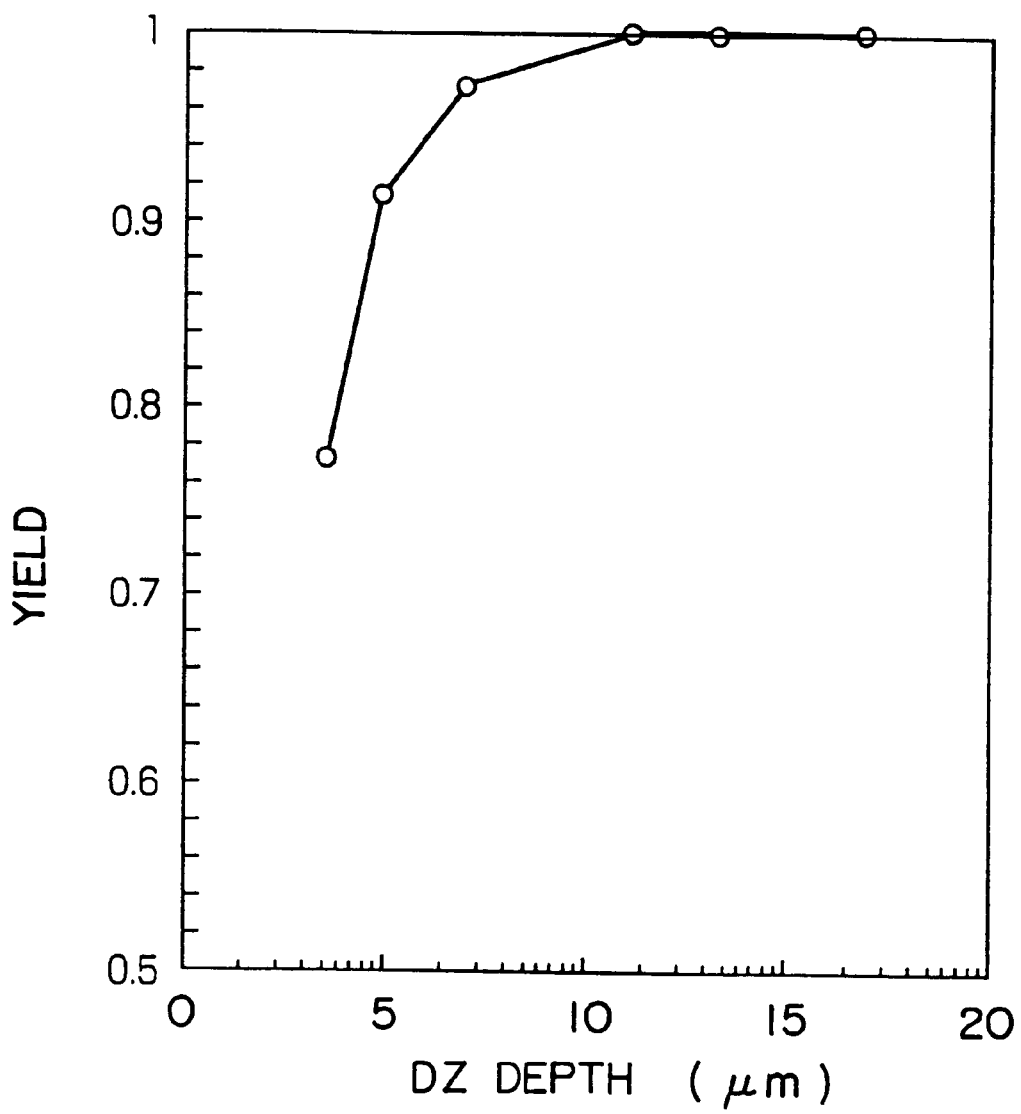
FIG. 5 is a graph showing dependency of the yield of DRAMs made from semiconductor substrates according to the invention upon DZ depth.

FIG. 5 is a graph showing changes in the yield of 64 M DRAMs depending upon their DZ depths when 64 M DRAMS are made from semiconductor substrates whose DZ depths were evaluated by the semiconductor substrate inspection method according to the invention. An apparent decrease in the yield was acknowledged in products with excessively narrow DZ depths. Although appropriate values of the DZ depth vary with devices, the invention can change the DZ depth not only by changing the medium-temperature annealing conditions (time and/or temperature) but also by changing the low-temperature annealing conditions (time and/or temperature).

Although the above description has been made taking trench-type devices, the same or equivalent effects can be obtained even with stack-type devices, processors and other non-trench-type devices.

The first annealing and the second annealing in the present invention may be performed also in the device manufacturing process. In this case, each of the first annealing and the second annealing is used as a single annealing step, or a plurality of annealing steps may be combined to obtain predetermined BMD density and DZ depth. It is also possible to fabricate DZ by utilizing one or more of other heat processing intended for other purposes, such as CVD, oxidization, or other like steps. As described with the fifth embodiment as well, since fabrication of DZ is affected by the annealing temperature and time and not affected by the atmosphere and the film, a CVD step can be used as an annealing step for making DZ.

Furthermore, the first silicon single crystal layer can be formed by modified CZ methods, for example, MCZ (Magnetic Field Applied CZ) method, CCZ (Continuous CZ) method and DLCZ (Double Layered CZ) method. In the MCZ method, any directions and shapes of applied magnetic field can be employed.

What is claimed is:

1. A method for manufacturing a semiconductor substrate, the method comprising first annealing, in a first temperature range, a silicon single crystal comprising boron at a first concentration to precipitate oxygen embryos or to grow oxygen precipitations within a region at a principal surface of the silicon single crystal; and second annealing the silicon single crystal, in a second temperature range higher than the first temperature range but low enough to prevent redistribution of boron from affecting device characteristics, to contract said oxygen embryos or said oxygen precipitations and form a denuded zone within the region at the principal surface.

2. The method according to claim 1, wherein said first annealing permits said oxygen embryos or said oxygen precipitations to contract in said second annealing.

3. The method according to claim 2, wherein said second annealing causes said oxygen embryos or said oxygen precipitations to contract.

4. The method according to claim 1, further comprising forming a second single crystal silicon layer on the principal surface after said first annealing, wherein said second single crystal silicon layer comprises boron at a second concentration lower than said first concentration.

5. The method according to claim 4, wherein said second single crystal silicon layer is formed by epitaxial growth.

6. The method according to claim 4, wherein said second annealing is performed after said first annealing and before the forming of said second single crystal silicon layer.

7. The method according to claim 6, wherein said second annealing causes said oxygen embryos or said oxygen precipitations to contract.

8. The method according to claim 1, wherein said region at the principal surface includes a device-forming region of said semiconductor substrate, and said first annealing, said second annealing and other manufacturing processes provide an oxygen dispersion depth sufficient to ensure a required denuded zone depth.

9. A manufacturing method for manufacturing a semiconductor substrate, the method comprising forming a silicon single crystal layer on a principal surface of a silicon single crystal plate, said silicon single crystal plate having a region at the principal surface that contains boron at a first concentration, and said single crystal layer containing boron at a second concentration lower than the first concentration;

annealing said silicon single crystal layer and said silicon single crystal plate to permit oxygen embryos or oxygen precipitations grown from oxygen embryos in the region to contract said oxygen embryos and oxygen precipitations, to form a denuded zone in said region at the principal surface.

10. The method according to claim 9, wherein said forming a silicon single crystal layer uses epitaxial growth.

11. A method for manufacturing a semiconductor substrate, the method comprising first annealing a silicon single crystal containing a region with a boron concentration not lower than $10^{18}$ atoms/cm$^3$ in a range of temperatures from 450° C. to 750° C.; and then second annealing said crystal in a range of temperatures from 900° C. to 1100° C.

12. A method for manufacturing a semiconductor substrate, the method comprising forming a second silicon single crystal layer on a first silicon single crystal layer with a boron concentration not lower than $10^{18}$ atoms/cm$^3$;

first annealing said first and second silicon single crystal layers in a range of temperatures from 450° C. to 750° C.; and then second annealing said first and second silicon single crystal layers in a range of temperatures from 900° C. to 1100° C.

13. The method according to claim 12, wherein said first silicon single crystal layer is a substrate cut out from single crystal silicon produced by a Czochralski method, and said forming a second silicon single crystal layer uses epitaxial growth.

14. A method for manufacturing a semiconductor substrate, the method comprising first annealing a silicon single crystal plate containing a region with a boron concentration not lower than $10^{18}$ atoms/cm$^3$ in a range of temperatures from 450° C. to 750° C.;

forming a silicon single crystal layer on said silicon single crystal plate by epitaxial growth; and then second annealing said single crystal plate and said silicon single crystal layer in a range of temperatures from 900° C. to 1100° C.

15. A method for manufacturing a semiconductor substrate, the method comprising first annealing a silicon single crystal plate containing a region with a boron concentration not lower than $10^{18}$ atoms/cm$^3$ in a range of temperatures from 450° C. to 750° C.;

second annealing said silicon single crystal plate in a range of temperatures from 900° C. to 1100° C.; and forming a silicon single crystal layer on said silicon single crystal plate by epitaxial growth.

16. A method for manufacturing a semiconductor substrate, the method comprising forming a silicon single crystal layer on a silicon single crystal plate containing a region with a boron concentration not lower than $10^{18}$ atoms/cm$^3$ by epitaxial growth;

first annealing said silicon single crystal plate and said silicon single crystal layer in a range of temperatures from 450° C. to 750° C.; and second annealing said silicon single crystal plate and said silicon single crystal layer in a range of temperatures from 900° C. to 1100° C.

17. A method for inspecting a semiconductor substrate, the method comprising first annealing a silicon single crystal, said silicon single crystal having a region that contains boron at a concentration which permits oxygen embryos or oxygen precipitations grown from oxygen embryos to contract in a subsequent annealing, said first annealing using a temperature within a range which permits said oxygen embryos or said oxygen precipitations to contract in said subsequent annealing;

second annealing, as said subsequent annealing, said substrate at a temperature that is higher than said range of temperatures used in said first annealing, is sufficient to contract said oxygen embryos, and is within a range of temperatures which prevent redistribution of boron from affecting device characteristics; and measuring, subsequent to said first annealing and said second annealing, a density of oxygen embryos grown into oxygen precipitations among those precipitated in said silicon single crystal.

18. The method according to claim 17, wherein a period of time of said second annealing is set such that oxygen dispersion depths by said first annealing, said second annealing and other annealings in a process for manufacturing a semiconductor device using a finally prepared semiconductor substrate amount to a depth necessary for a non-defective layer.

19. A method for inspecting a semiconductor substrate, the method comprising first annealing a silicon single crystal containing a region with a boron concentration not lower than $10^{18}$ atoms/cm$^3$ in a range of temperatures from 450° C. to 750° C.; then second annealing said crystal in a range of temperatures from 900° C. to 1100° C.; and measuring a density of oxygen precipitations in said silicon single crystal.

20. The method according to claim 19, wherein a period of time of said second annealing is set such that depths of oxygen dispersion by said first annealing, said second annealing and other annealings in a process for manufacturing a semiconductor device using a finally prepared semiconductor substrate amount to a depth necessary for a non-defective layer.

* * * * *